United States Patent
Oi

(10) Patent No.: US 9,615,442 B2
(45) Date of Patent: Apr. 4, 2017

(54) POWER MODULE SUBSTRATE AND POWER MODULE

(71) Applicant: MITSUBISHI MATERIALS CORPORATION, Tokyo (JP)

(72) Inventor: Sotaro Oi, Kitamoto (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 19 days.

(21) Appl. No.: 14/423,281

(22) PCT Filed: Jun. 27, 2013

(86) PCT No.: PCT/JP2013/067645
§ 371 (c)(1),
(2) Date: Feb. 23, 2015

(87) PCT Pub. No.: WO2014/034245
PCT Pub. Date: Mar. 6, 2014

(65) Prior Publication Data
US 2015/0223317 A1     Aug. 6, 2015

(30) Foreign Application Priority Data
Aug. 31, 2012   (JP) ................. 2012-191607

(51) Int. Cl.
*H05K 1/02* (2006.01)
*H01L 23/373* (2006.01)
(Continued)

(52) U.S. Cl.
CPC ....... *H05K 1/0203* (2013.01); *H01L 23/3735* (2013.01); *H01L 23/4334* (2013.01);
(Continued)

(58) Field of Classification Search
CPC ............... H05K 7/2039; H05K 7/205; H05K 7/2089–7/209; H05K 1/0203;
(Continued)

(56) References Cited

U.S. PATENT DOCUMENTS

| 4,766,481 A | 8/1988 | Gobrecht et al. |
| 5,465,898 A | 11/1995 | Schulz-Harder et al. |

(Continued)

FOREIGN PATENT DOCUMENTS

| DE | 44 44 680 A1 | 6/1996 | |
| DE | 19749987 A1 * | 12/1997 | ........... H01L 23/047 |

(Continued)

OTHER PUBLICATIONS

Supplementary European Search Report mailed Mar. 14, 2016, issued for the European patent application No. 13833834.8.
(Continued)

*Primary Examiner* — Zachary M Pape
*Assistant Examiner* — Amir Jalali
(74) *Attorney, Agent, or Firm* — Locke Lord LLP

(57) ABSTRACT

A power-module substrate includes first and second sets of circuit-layer metal-plates, a first ceramic substrate, a metal member connecting the first and second sets of circuit-layer metal-plates through a hole formed in the first ceramic substrate, a second ceramic substrate, a heat-radiation-layer metal-plate, and an electric component attached to a top surface of one of the first set of circuit-layer metal-plates above the metal member and the through hole. The power-module substrate is configured to conduct heat from the electric component through the through hole via the metal member, along the second set of circuit-layer metal-plates, and to the heat-radiation-layer metal-plate.

18 Claims, 6 Drawing Sheets

(51) Int. Cl.

| | | |
|---|---|---|
| *H01L 23/433* | (2006.01) | |
| *H05K 1/03* | (2006.01) | |
| *H05K 1/09* | (2006.01) | |
| *H05K 1/11* | (2006.01) | |
| *H05K 1/18* | (2006.01) | |
| *H01L 23/498* | (2006.01) | |

(52) U.S. Cl.
CPC ......... *H05K 1/0271* (2013.01); *H05K 1/0298* (2013.01); *H05K 1/0306* (2013.01); *H05K 1/09* (2013.01); *H05K 1/115* (2013.01); *H05K 1/181* (2013.01); *H01L 23/49811* (2013.01); *H01L 23/49861* (2013.01); *H01L 2924/0002* (2013.01); *H05K 2201/017* (2013.01)

(58) Field of Classification Search
CPC .. H05K 1/0271; H05K 1/0298; H05K 1/0306; H05K 1/09; H05K 1/115; H05K 1/181; H05K 2201/017; H05K 2201/10416; H05K 2201/06–2201/068; H01L 23/3735; H01L 23/4334; H01L 23/49811; H01L 23/49861; H01L 2924/0002
USPC ......... 361/715–716, 722–723, 709; 257/706; 174/252
See application file for complete search history.

(56) References Cited

U.S. PATENT DOCUMENTS

| | | | | |
|---|---|---|---|---|
| 6,806,567 | B2* | 10/2004 | Hembree | H01L 21/4871 257/675 |
| 8,304,882 | B2* | 11/2012 | Oka | H01L 21/565 257/687 |
| 8,502,385 | B2* | 8/2013 | Oka | H01L 21/56 257/170 |
| 8,604,610 | B1* | 12/2013 | Hughes | H01L 23/4334 257/675 |
| 2006/0056213 | A1* | 3/2006 | Lee | H01L 23/4334 363/144 |
| 2009/0039498 | A1 | 2/2009 | Bayerer | |
| 2009/0194869 | A1* | 8/2009 | Eom | H01L 23/367 257/712 |
| 2009/0218665 | A1* | 9/2009 | Yang | H01L 23/13 257/676 |
| 2009/0243078 | A1* | 10/2009 | Lim | H01L 23/4334 257/690 |
| 2010/0013086 | A1* | 1/2010 | Obiraki | H01L 23/3121 257/693 |
| 2010/0127383 | A1* | 5/2010 | Oka | H01L 24/40 257/692 |
| 2010/0133667 | A1* | 6/2010 | Oka | H01L 23/3735 257/666 |
| 2010/0327455 | A1* | 12/2010 | Nishihata | H01L 23/473 257/773 |
| 2011/0012252 | A1* | 1/2011 | Gao | H01L 25/071 257/698 |
| 2011/0180938 | A1* | 7/2011 | Hirasawa | C08L 83/04 257/778 |
| 2011/0298121 | A1* | 12/2011 | Nishibori | H01L 23/24 257/713 |
| 2011/0309512 | A1* | 12/2011 | Gejima | H01L 23/053 257/771 |
| 2012/0092842 | A1* | 4/2012 | Neumeister | H01L 23/3107 361/761 |
| 2012/0162931 | A1* | 6/2012 | Kim | H01L 23/3121 361/729 |
| 2012/0267149 | A1* | 10/2012 | Oi | H01L 21/4807 174/255 |
| 2013/0069210 | A1* | 3/2013 | Lee | H01L 23/4334 257/666 |
| 2013/0105953 | A1* | 5/2013 | Kim | H01L 23/4334 257/666 |
| 2013/0148314 | A1* | 6/2013 | Hirai | H05K 7/06 361/748 |
| 2013/0264702 | A1* | 10/2013 | Nishi | H01L 23/36 257/712 |
| 2015/0359107 | A1* | 12/2015 | Steinau | H01L 23/4334 361/709 |
| 2016/0111345 | A1* | 4/2016 | Kawase | H01L 23/36 307/10.1 |

FOREIGN PATENT DOCUMENTS

| | | |
|---|---|---|
| DE | 197 29 677 A1 | 1/1999 |
| DE | 197 49 987 A1 | 6/1999 |
| JP | 63-252456 A | 10/1988 |
| JP | 04-030497 A | 2/1992 |
| JP | 05-251602 A | 9/1993 |
| JP | 08-139480 A | 5/1996 |
| JP | 10-093244 A | 4/1998 |
| JP | 11-340600 A | 12/1999 |
| JP | 2002-076214 A | 3/2002 |
| JP | 2002-329939 A | 11/2002 |
| JP | 2007-281498 A | 10/2007 |
| JP | 4311303 B2 | 8/2009 |
| JP | 4565249 B2 | 10/2010 |
| JP | 4646417 B2 | 3/2011 |
| JP | 2011-091111 A | 5/2011 |

OTHER PUBLICATIONS

International Search Report mailed Sep. 17, 2013, issued for PCT/JP2013/067645.

* cited by examiner

POWER MODULE SUBSTRATE AND POWER MODULE

BACKGROUND OF THE INVENTION

Field of the Invention

The present invention relates to a power-module substrate and power module used for a semiconductor device controlling a large electric current and a large voltage.

Priority is claimed on Japanese Patent Application No. 2012-191607, filed Aug. 31, 2012, the content of which is incorporated herein by reference.

Description of the Related Art

Conventionally, a power module in which: a metal plate forming a conductor-pattern layer is laminated on one surface of a ceramic substrate; an electronic component such as a semiconductor chip is soldered on the conductor-pattern layer; a metal plate being a heat-radiation layer is formed on another surface of the ceramic substrate; and a heat sink is bonded to the heat-radiation layer is known.

In a power-module substrate for the power module, the metal plates are bonded on the surfaces of the ceramic substrate by brazing. For example, in Patent Document 1, a power-module substrate in which a metal plate and a ceramic substrate are brazed is manufactured by: temporarily tacking a brazing-material foil on a surface of the ceramic substrate by surface tension of volatile organic-medium; heating a conductor-pattern layer which is stamped out from a base material in a state of temporary tacking on a surface of the brazing-material foil so as to volatilize the volatile organic-medium; and pressing it in a thickness direction.

Meanwhile, the power-module substrate of this type is required to have a function of a circuit board along with high integration in recent years other than a function of an insulated board and a function of a heat-radiation board, so multi-layering is examined.

For example, in a metal-ceramic bonded substrate (i.e., a power-module substrate) disclosed in Patent Document 2, a plurality of ceramic substrates in which through holes for via holes are formed and metal plates intermediate between the ceramic substrates are provided in a multi-layered structure. In this case, the metal plates are formed by casting molten metal into a mold in which the ceramic substrates are stacked and solidifying the molten metal. Accordingly, the molten metal is poured into the through holes formed in the ceramic substrates and then solidified. As a result, the metal plates on the both side of the ceramic substrates are electrically connected to each other via the metal in the through holes.

In Patent Document 3, it is disclosed that a metal post is provided in a through hole formed in a ceramic substrate and also metal plates on both sides of the ceramic substrate are electrically connected by the metal post.

PRIOR ART DOCUMENT

Patent Document

Patent Document 1: Japanese Examined Patent Application, Second Publication No. 4311303
Patent Document 2: Japanese Examined Patent Application, Second Publication No. 4565249
Patent Document 3: Japanese Examined Patent Application, Second Publication No. 4646417

SUMMARY OF THE INVENTION

Problems to be Solved by the Invention

In such power-module substrates having a multi-layered structure, in order to meet higher integration, a higher performance is required in a power cycle since heat stress is frequently affected along with heat by electric components; and moreover, improvement of a performance is required in a heat cycle along with environmental-temperature fluctuation.

The present invention is achieved in consideration of the above circumstances, and has an object to provide: a power-module substrate having a multi-layered structure improving a performance of a power-cycle and a performance of a heat cycle, and meeting higher-integration; and a power module using the power-module substrate.

Means for Solving the Problem

A power-module substrate according to the present invention is characterized in that: a plurality of circuit-layer metal-plates made of copper or copper alloy are bonded in a layered state intermediating a first ceramic substrate; a metal member connecting both the circuit-layer metal-plates disposed on both surfaces of the first ceramic substrate is inserted into a through hole formed in the first ceramic substrate; a second ceramic substrate is bonded on a surface of one side of the circuit-layer metal-plates in the layered state; and a heat-radiation-layer metal-plate made of aluminum or aluminum alloy is bonded on a surface of the second ceramic substrate counter to the circuit-layer metal-plates.

Since the plurality of circuit-layer metal-plates in the layered state intermediating the first ceramic substrate are in a connected state by the metal member, a multi-layered circuit layer is formed, so that it is possible to construct a high-integrated circuit layer. Moreover, since the circuit layer is formed of copper or copper alloy having an excellent performance of heat conductivity, heat from a semiconductor device mounted thereon can be immediately radiated, distortion or cracks are not generated in a solder layer bonding the semiconductor device, and the solder layer can be maintained healthily for a long term. As a result, a power-cycle performance can be improved.

Meanwhile, since the heat-radiation-layer metal-plate made of aluminum or aluminum alloy is bonded on the other surface of the second ceramic substrate, generation of stress along with thermal-expansion difference with respect to the ceramic substrate is lightened, and breakage or clacks of the ceramic substrate is prevented from being generated. As a result, a heat-cycle performance can be improved.

In the power-module substrate of the present invention, it is preferable that a lead-terminal part for external connection protruding outward from the first ceramic substrate be formed integrally on the circuit-layer metal-plate at a middle stage disposed between the first ceramic substrate and the second ceramic substrate.

The circuit-layer metal-plate at a top stage tends to be large in a surface direction in a case in which a lead-terminal part is formed thereon since the electric component is mounted so that a circuit is necessary to be formed so as to avoid with an electric circuit for wiring to the external. However, in a case in which the metal plate at the middle stage is utilized, it is sufficient to form the lead-terminal part at a suitable position in periphery thereof; so that it is possible to reduce in size of the power-module substrate by restraining an expansion of a flat area.

In the power-module substrate of the present invention, it is preferable that: a protrusion part protruding outward from the first ceramic substrate be formed on the second ceramic substrate; and at least a part of the lead-terminal part be supported on the protrusion part on the second ceramic substrate.

The second ceramic substrate can share a load when a bonding wire and the like are connected to the lead-terminal part, so that deformation of the lead-terminal part can be prevented.

In the power-module substrate of the present invention, it is preferable that in a circuit layer at a middle stage formed between the first ceramic substrate and the second ceramic substrate, a hole part opening at an end of the circuit layer at the middle stage be formed.

A power module according to the present invention is characterized in that: providing the power-module substrate and an electric component bonded on the circuit-layer metal-plates disposed on the first ceramic substrate, the power-module substrate and the electric component are sealed by a resin mold except a surface of the heat-radiation-layer metal-plate.

Since the electric component and the power-module substrate are sealed by the resin mold, the resin is led around or between the substrates stacked between the electric component and the heat-radiation layer or the metal plate and the electric component, so that the resin mold can be rigidly held on the power-module substrate and bondability of the electric component can be favorably maintained.

Moreover, since the electric component and the power-module substrate in which a bend is reduced are sealed by the resin mold, thickness of the resin is even at a side of the circuit-layer on which the electric component is mounted, so that bonding reliability of the solder layer can be maintained when the power cycle is applied.

Particularly, in a case in which there is the hole part on the circuit layer at the middle stage, the resin is led into the hole part, so that the resin mold can be rigidly held on the power-module substrate.

A heat-sink-attached power module according to the present invention may include: the power-module substrate; a heat sink bonded to the heat-radiation-layer metal-plate of the power-module substrate; and an electric component bonded on the circuit-layer metal-plate disposed on the first ceramic substrate, the power module in which: the power-module substrate and the electric component may be sealed by a resin mold; and a part of the heat sink may be covered with the resin mold.

Effects of the Invention

According to the present invention, since the circuit-layer metal-plates are made of copper or copper alloy and the heat-radiation-layer metal-plate is made of aluminum or aluminum alloy, the high performances in both the power cycle and the heat cycle can be demonstrated, so that the multi-layered power-module substrate having long-term high reliability can be obtained.

DETAILED DESCRIPTION OF THE INVENTION

Below, an embodiment of the present invention will be explained referring the drawings.

Figure 1:
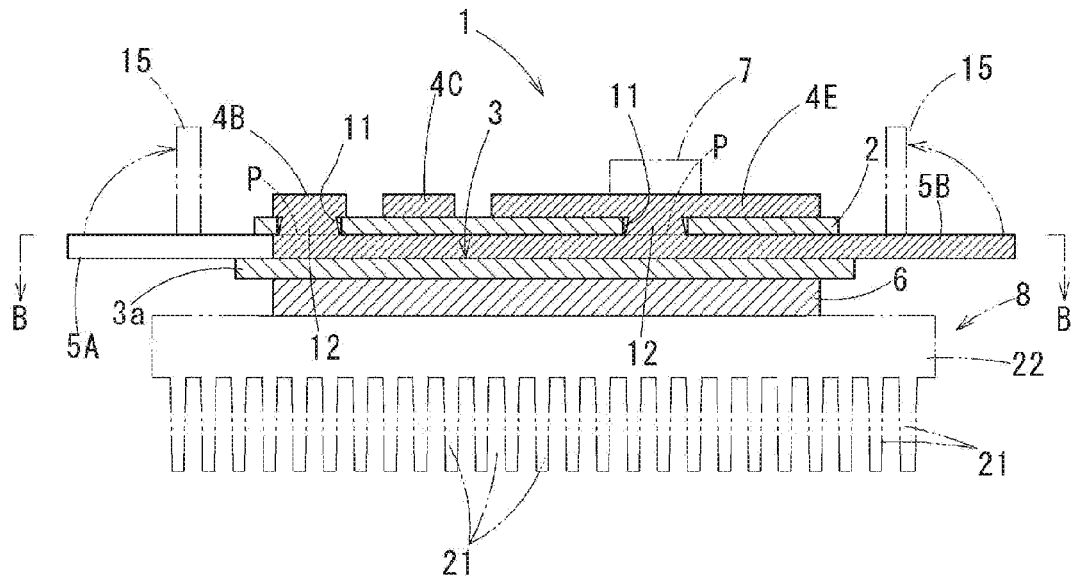
FIG. 1 It is a longitudinal sectional view showing a first embodiment of a power-module substrate according to the present invention, corresponding to an arrow view taken along the line A-A in FIG. 2.
Figure 2:
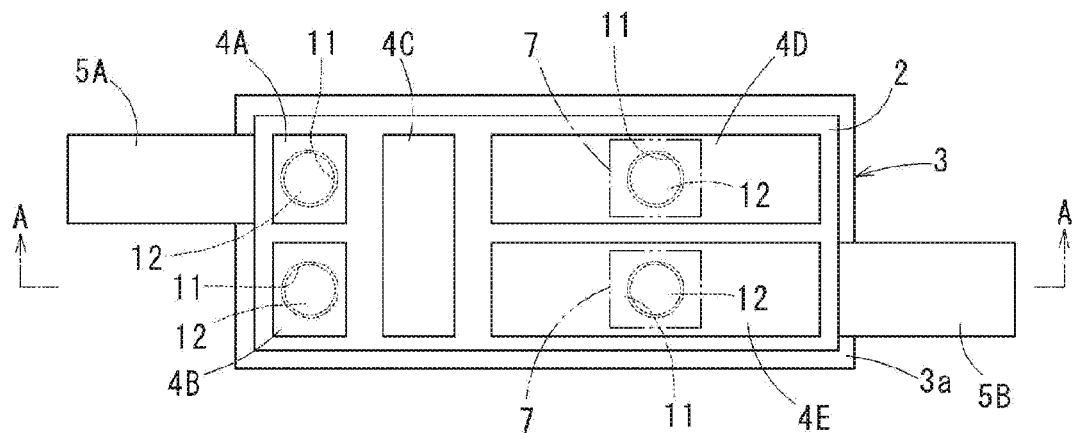
FIG. 2 It is a plan view of the power-module substrate in FIG. 1.

In a power-module substrate 1, as shown in FIG. 1 and FIG. 2, a plurality of ceramic substrate 2 and 3, circuit-layer metal-plates 4A to 4E, 5A, and 5B, and a heat-radiation-layer metal-plate 6 are stacked and bonded to each other by brazing or the like; electric components 7 are mounted on a part of the circuit-layer metal-plates 4A to 4E (4D and 4E in an illustrated example) which are disposed at an top stage; and a heat sink 8 is bonded on the heat-radiation-layer metal-plate 6 disposed at a lowest stage.

The ceramic substrates 2 and 3 are formed to have a thickness of, for example, 0.32 mm to 1.0 mm from AlN, $Al_2O_3$, SiC or the like. The circuit-layer metal-plates 4A to 4E, 5A, and 5B are made of pure copper or copper alloy such as oxygen-free copper, tough-pitch copper or the like. The heat-radiation layer metal-plate 6 is made of pure aluminum having purity of 99.90% or higher or aluminum alloy. Thicknesses of these metal plates are set to, for example, 0.25 mm to 2.5 mm.

These bonding processes are performed by two separated steps as described below: at first, the circuit-layer metal-plates 4A to 4E, 5A, and 5B are bonded on both the ceramic substrates 2 and 3, and then the heat-radiation-layer metal-plate 6 is bonded on the second ceramic substrate 3. In this case, for example, for bonding the circuit-layer metal-plates 4A to 4E, 5A, and 5B on both the ceramic substrate 2 and 3, reactive-metal brazing-material of Ag-27.4 mass % Cu-2.0 mass % Ti is used; and Al—Si based brazing material or Al—Ge based brazing material is used for bonding the second ceramic substrate 3 and the heat-radiation-layer metal-plate 6.

In the illustrated example, two ceramic substrates, the first ceramic substrate 2 and the second ceramic substrate 3 are used; and the circuit-layer metal-plates 4A to 4E, 5A, and 5B are disposed on both surfaces of the first ceramic substrate 2. The circuit-layer metal-plates 5A and 5B opposite of the circuit-layer metal-plates 4A to 4E at the top stage are bonded on the second ceramic substrate 3. On this second ceramic plate 3, the heat-radiation-layer metal-plate 6 is bonded at an opposite surface to the circuit-layer metal-plates 5A and 5B.

Figure 3:
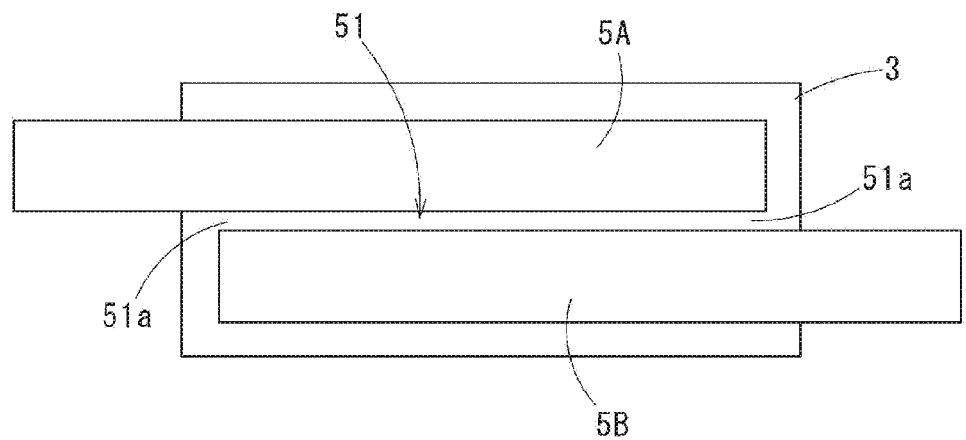
FIG. 3 It is a plan view taken along the line B-B in FIG. 1.
Figure 4:
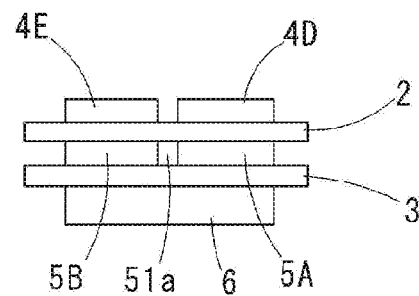
FIG. 4 It is a right-side view of FIG. 1.

As shown in FIG. 2 and FIG. 3, five of the circuit-layer metal-plates 4A to 4E, 5A, and 5B are disposed at the top stage; two of them are disposed at a middle stage between both the ceramic substrates; and the heat-radiation-layer metal-plate 6 is provided at the lowest stage. The five circuit-layer metal-plates 4A to 4E at the top stage are disposed so that one (4C) of them is disposed at the middle position, and at both sides of it, two (4A and 4B; 4D and 4E) of them are disposed respectively. The circuit-layer metal-plates 5A and 5B between the ceramic substrates 2 and 3 are formed so as to have a length which can connect the metal plates 4A and 4D and the metal plates 4B and 4E respectively disposed at both sides of the top stage and the length in which an end thereof is protruded from an end edge of the first ceramic substrate 2 in a long-and-narrow band-plate shape, disposed to be parallel to each other, and protruded respectively from the end edges of the first ceramic substrate 2 in an opposite direction. A circuit layer at the upper stage is formed by the five circuit-layer metal-plates 4A to 4E on the first ceramic substrate 2. A circuit layer at the middle stage is formed by the circuit-layer metal-plates 5A and 5B disposed between both the ceramic substrates 2 and 3. As shown in FIG. 3 and FIG. 4, since both the circuit-layer metal-plates 5A and 5B are disposed with intervals in the circuit layer at the middle stage, a hole 51 is formed to be surrounded by the circuit-layer metal-plates 5A and 5B and both the ceramic substrates 2 and 3; and an opening part 51a is open at an end thereof.

The circuit-layer metal-plates 4A and 4D and the circuit-layer metal-plates 4B and 4E at the top stage make pairs respectively so as to be connected below the circuit-layer metal-plate 4C at the middle stage, in an electrically connected state respectively by the circuit-layer metal plates 5A and 5B at the middle stage.

Figure 5:
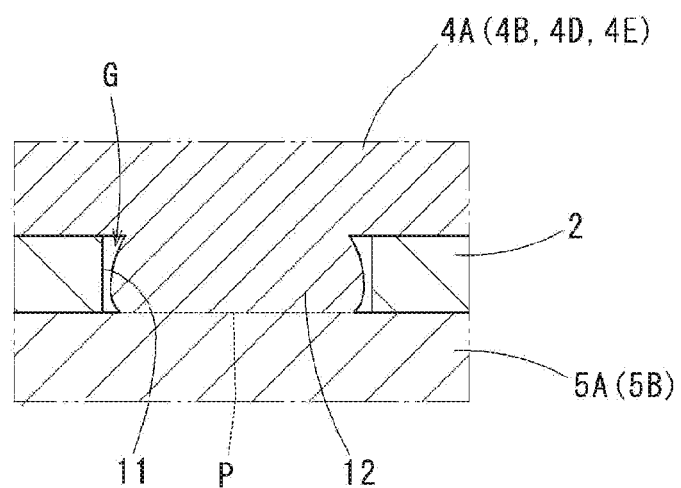
FIG. 5 It is an enlarged sectional view showing a vicinity of a bonding part in FIG. 1.

Structure as the connected state is that: four through holes 11 are formed on the first ceramic substrate 2; columnar protruded parts 12 (corresponding to metal members of the present invention) are formed integrally on respective one surface of the four circuit-layer metal plates 4A, 4B, 4D, and 4E except for the circuit-layer metal plate 4C at a middle position among the aforementioned five circuit-layer metal-plates 4A to 4E at the top stage; and the protruded parts 12 are inserted into the through holes 11 respectively so as to be connected to the circuit-layer metal plates 5A and 5B at the middle stage between both the ceramic substrates 2 and 3. In this case, as shown in FIG. 5, the protruded parts 12 are connected to the circuit-layer metal plate 5A and 5B at the middle stage, and slightly expanded at vicinities of middle parts thereof between bonding parts P to the circuit-layer metal plates 5A and 5B at the middle stage and a lower surface of the circuit-layer metal plates 4A, 4B, 4D, and 4E by plastic deformation: however, gaps G are formed between inner peripheral surfaces of the through holes 11 and the protrude parts 12.

In the present embodiment, it is explained by the power-module substrate having the structure of two plates, the first ceramic substrate 2 with the through holes 11 and the second ceramic substrate 3 without the through holes 11. However, structure having a plurality of plates, the first ceramic plates 2 or the second ceramic plates 3 can be applied.

Protruded end parts of the circuit-layer metal-plates 5A and 5B at the middle stage sidewise from the first ceramic substrate 2 are folded at middle parts thereof as shown by the two-dotted line in FIG. 1 and used as external-connection lead-terminal parts 15. In this case, since the second ceramic substrate 3 is formed to have a flat area larger than that of the first ceramic substrate 2, an outer peripheral part of the second ceramic substrate 3 is projected outward from the first ceramic substrate 2, so that a part of the lead-terminal parts 15 is held on an upper surface of a projection part 3a of the second ceramic substrate 3 projecting outward from the first ceramic substrate 2.

Next, a method for manufacturing the power-module substrate 1 configured as above will be described.

The first ceramic substrate 2 having the through holes 11 among the ceramic substrates 2 and 3 can be obtained by baking after forming thorough holes at a green sheet by press working before baking ceramics. Outline thereof is worked after baking. Outline machining is performed on the ceramic substrate 3 without through holes after baking a green sheet.

Figure 6:
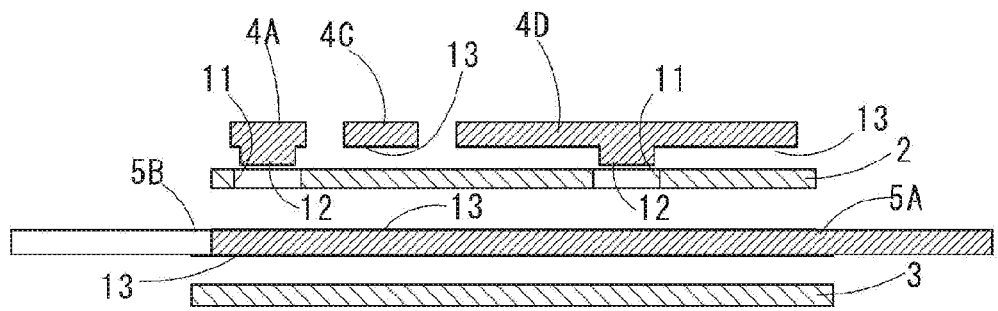
FIG. 6 It is an exploded sectional view showing a state before bonding of a first bonding.
Figure 9:
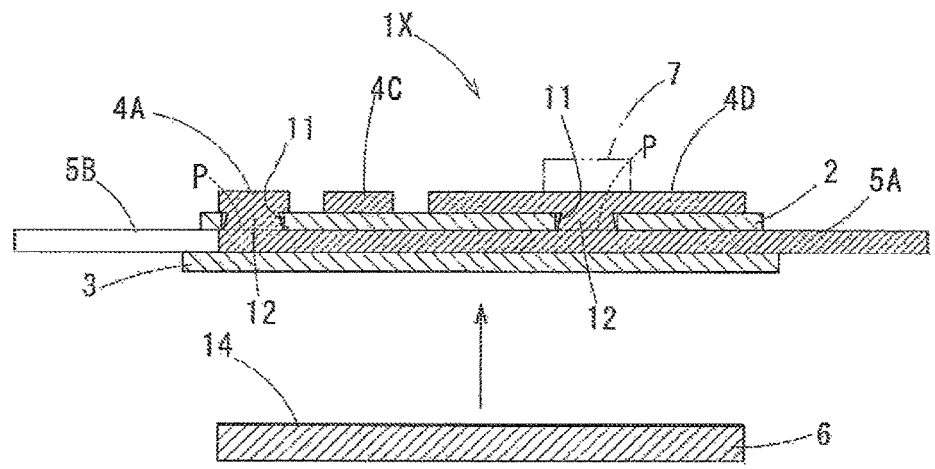
FIG. 9 It is an exploded sectional view showing a state before bonding of a first bonded body and a heat-radiation-layer metal-plate.

As shown in FIG. 6 and FIG. 9, the circuit-layer metal plates 4C, 5A, 5B, and heat-radiation metal plate 6 are made as metal plates on which brazing-material foils are stuck by: temporary fixing brazing materials 13 and 14 on surfaces thereof by volatile organic-medium or the like such as octanediol or the like; and stamping out together by press working. In this case, the reactive-metal brazing material 13, for example, made of Ag-27.4 mass % Cu-2.0 mass % Ti is stuck on one surface of the metal plate 4C at the top stage and both surfaces respective of the middle metal plates 5A and 5B, and the Al—Si based or Al—Ge based brazing material 14 is stuck on one surface of the heat-radiation metal plate 6 at the lowest stage.

Among the metal plates 4A to 4E at the top stage, the metal plates 4A, 4B, 4D, and 4E having the protruded parts 12 are made by: forming the protruded parts 12 on one surface by press working in advance; and sticking brazing-material foil in which holes are formed so as to omit the protruded parts 12 on a plane surface around the protruded parts 12.

Figure 7:
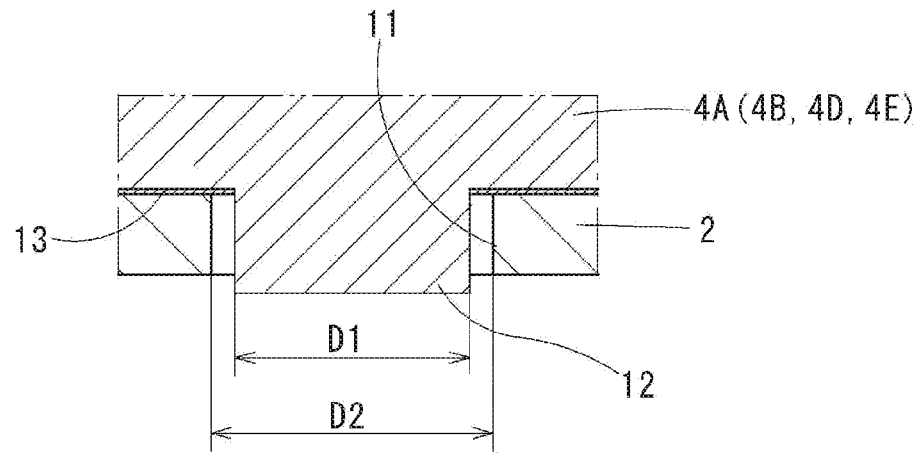
FIG. 7 It is an enlarged sectional view as FIG. 5 showing a dimensional relation between a through hole of a ceramic substrate and a protruded part of a circuit-layer metal-plate before bonding.

The protruded parts 12 formed as above have a length larger than a thickness of the ceramic substrate 2 having the through holes 11 so as to be slightly protruded from the ceramic substrate 2 when inserted into the through holes 11 as shown in FIG. 7. Considering dimensional dispersion of the thickness of the ceramic substrate 2, a length larger than an allowable maximum value by 0.02 mm to 0.2 mm, for example, a length larger by 0.05 mm is set. Since the protruded parts 12 are expanded in the diameter when pressurized as described below, an outer diameter D1 of the protruded parts 12 and an inner diameter D2 of the through holes 11 of the ceramic substrate 2 are formed so that gaps G can be formed even in the expanded state; therefore, the outer diameter D1 of the protruded parts 12 is 1.0 mm to 20 mm and the inner diameter D2 of the through holes 11 of the ceramic substrate 2 is 1.1 mm to 28 mm. For example, the outer diameter D1 of the protruded parts 12 is 10 mm and the inner diameter D2 of the through holes 11 is 13 mm.

The two ceramic substrates 2 and 3 and the metal plates 4A to 4E, 5A, 5B, and 6 formed as above are joined by two processes. First, the two ceramic substrates 2 and 3 and the metal plates 4A to 4E at the top stage and the metal plates 5A and 5B at the middle stage are joined in advance (first bonding); and then, the metal plate 6 at the lowest stage and the heat sink 8 are joined to the first bonded body (second bonding).

Figure 8:
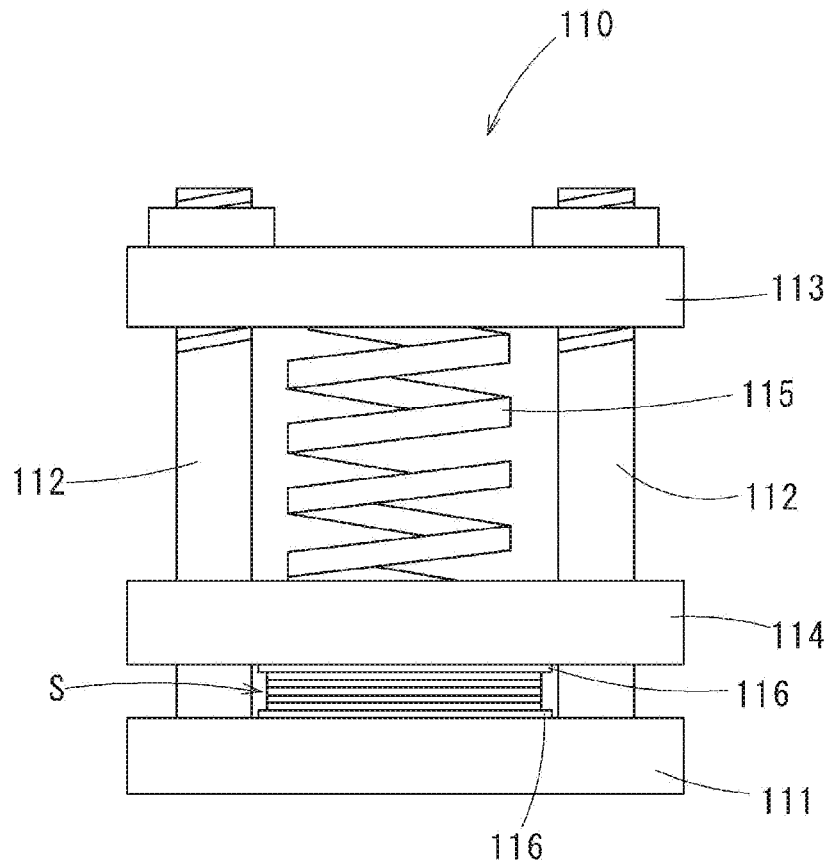
FIG. 8 It is a front view showing an example of a pressurizing device used for a manufacturing method according to the present invention.

In the first bonding, the ceramic substrates 2 and 3 and the metal plates 4A to 4E at the top stage or the metal plates 5A and 5B at the middle stage are stacked alternately; the protruded parts 12 of the metal plates 4A, 4B, 4D, and 4E are inserted into the corresponding through holes 11 of the ceramic substrate 2; and a stack body S is set on a pressurizing device shown in FIG. 8.

The pressurizing device 110 is provided with: a base plate 111; guide posts 112 vertically attached to four corners of the base plate 111; a fixing plate 113 fixed to upper ends of the guide posts 112; a pressurizing plate 114 held by the guide posts 112 so as to move vertically between the base plate 111 and the fixing plate 113; and an energizing device 115 energizing the pressurizing plate 114 downward such as a spring or the like, provided between the fixing plate 113 and the pressurizing plate 114.

The fixing plate 113 and the pressurizing plate 114 are disposed parallel to the base plate 111; and the above-mentioned stack body S is disposed between the base plate 111 and the pressurizing plate 114. Carbon sheets 116 are disposed on both surface of the stack body S in order to evenly pressurize.

In a state in which pressurizing is performed by the pressurizing device 110, the pressurizing device 110 is installed in a heating furnace (not shown); and brazing is performed by heating to brazing temperature, for example, 850° C.

In this brazing, Ti which is reactive metal in the brazing material is preferentially spread on the surfaces of the ceramic substrates 2 and 3 so as to make TiN, and connected to the metal plates 4A to 4E, 5A, and 5B through Ag—Cu alloy.

In order to apply load larger than a yield point on the protruded parts 12 of the metal plates 4A, 4B, 4D and 4E while performing this brazing, energizing force of the energizing device 115 is set in advance. Since yield stress of tough-pitch copper around 850° C. is about 3 to 4 MPa, for example, if the outer diameter D1 of the protruded parts 12 is 10 mm, the energizing force of the energizing device 115 at room temperature is set so as to apply load by 231 N or larger on the protruded parts 12 when the temperature is high as 850° C.

By setting the energizing force as above, the protruded parts 12 is bonded to the metal plates 5A and 5B at the middle while being collapsed by plastic deformation in brazing; and the flat surfaces of the metal plates 4A to 4E are closely in contact with the surface of the ceramic substrate 2 around the protruded parts 12: accordingly, it is possible to obtain a state of bonded evenly along a surface direction.

Also in a state after bonding, the protruded parts 12 are partially expanded in diameter; however, since it is set so that the gaps G are formed between the protruded parts 12 and the inner peripheral surfaces of the through holes 11 in a state of being expanded as described above, the protruded parts 12 are never pressed to the inner peripheral surfaces of the through holes 11.

Next, in the second bonding, as shown in FIG. 9, stacking the second ceramic substrate 3 of a first bonded body 1X on a surface on which the brazing material 14 of the metal plate 6 configuring the lowest stage is stuck, using the pressurizing device 110 described above, and performing the brazing by heating in a vacuum while pressurizing. Pressurizing force in this case is 0.68 MPa (7 kgf/cm$^2$) for example; and heating temperature is 630° C. for example.

The power-module substrate 1 manufactured as above is used by, as shown by the chain line in FIG. 1, being provided with the electric components 7 on a part of the metal plates 4A to 4E at the top stage, and fixing the heat sink 8 on the metal plate 6 at the lowest stage. The protruded end parts of the circuit-layer metal-plates 5A and 5B at the middle stage from the first ceramic substrate 2 are the external-connection lead-terminal parts 15 by being folded.

In addition, the heat sink 8 is made from A6063 aluminum alloy by extrusion molding, for example. In the illustrated example, by being extruded in an orthogonal direction to a page surface, straight fins 21 are formed in a band-plate shape along the extrusion direction. Although it is not dimensionally limited, for example, on a surface of a plate-shape part 22 of 50 mm square and 5 mm thickness, the plurality of straight fins 21 of 4 mm thickness and 15 mm height along the extrusion direction are formed. The heat sink 8 is fixed on the metal plate 6 by brazing, screw cramping, or the like. Additionally, when brazing the heat sink 8 on the metal plate 6, it is possible to braze by using Al—Si based brazing material or Al—Ge based brazing material, pressing at 0.68 MPa (7 kgf/cm$^2$) of pressurizing force for example, and heating at 610° C. of heating temperature for example.

In the power-module substrate 1, since the gap G is formed between the protruded parts 12 and the inner peripheral surfaces of the through holes 11, heat stress at parts of the through holes 11 is reduced even though thermal expansion is repeated by temperature cycle while using, and exfoliation of the bonding part or breakage of the ceramic substrates 2 and 3 are prevented; as a result, high reliability can be maintained as a power-module substrate.

Heat generated at the electric components 7 which are mounted on the metal plates 4D and 4E at the top stage is transferred to the metal plates 5A and 5B at the middle through the protruded parts 12 from the metal plates 4D and 4E. However, if the protruded parts 12 are disposed at directly under the electric components 7, heat is transferred linearly to the metal plates 5A and 5B from the metal plates 4D and 4E at the middle through the protruded parts 12 and can be immediately radiated. In order to improve the radiation property, it is preferable that the outer diameter D1 of the protruded parts 12 be large; for example, if a cross-sectional area is larger than a projected area of the electric components 7, excellent radiation property can be obtained by installing the electric components 7 so as to follow an extension of the protruded parts 12. Moreover, since large electric current flows for a power module, it is preferable that the protruded parts 12 have the larger sectional area since current density is small.

In a case in which a circuit is separated by the plurality of metal plates 5A and 5B at the middle as shown in FIG. 3, there is difficulty in manufacturing by pouring molten metal as described in aforementioned Patent Document 2. However, according to the method of the present invention, it is easy to manufacture structure of the circuit separated by the metal plate at the middle. In this case, it is possible to make opposite side edges of both the metal plates 5A and 5B into a folded state of L-shape or the like; not only the shape, a number and the like of the metal plates at the middle stage can be optionally set. As a result, design flexibility is improved and it is favorable for higher integration.

Furthermore, in the power module in which the electric components are mounted on the power-module substrate according to the present embodiment, it is possible to seal by a resin mold for a sake of fixing the electric components, insulation, and the like.

Figure 10:
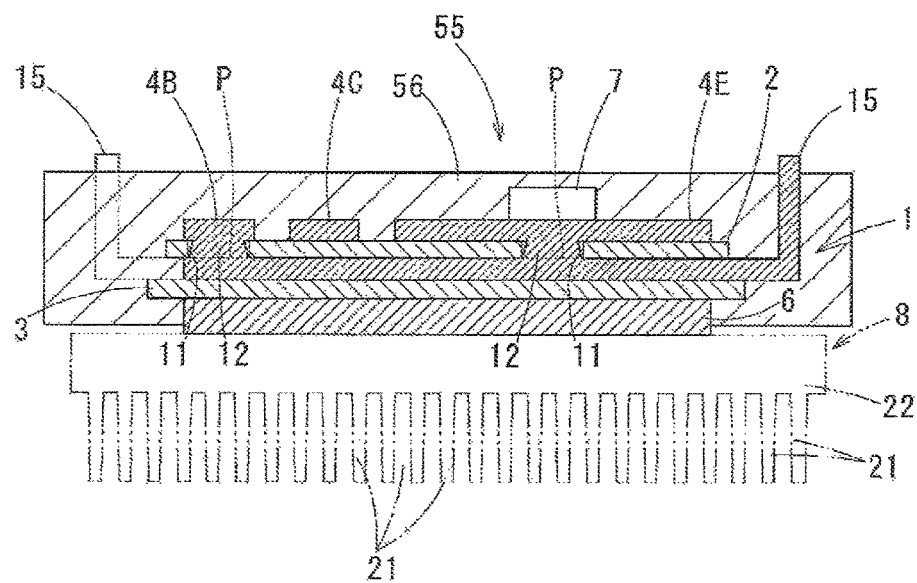
FIG. 10 It is a cross-sectional view of a power module in which an electric component is mounted on the power-module substrate of FIG. 1 and a resin mold is formed.

FIG. 10 shows a power module in which a resin mold is formed. In the power module 55, the power-module substrate 1 and the electric components 7 are resin-sealed by a resin mold 56 such as epoxy resin or the like except for the surface of the heat-radiation-layer metal-plate 6. As a result, resin is poured into the vicinity or gaps of the plurality of ceramic substrates 2 and 3 and the circuit-layer metal-plates 4A, 4B, 4D, 4E, 5A, and 5B stacked between the electric components 7 and the heat-radiation-layer metal-plate 6 and the electric components 7, it is possible to rigidly hold the resin mold 56 on the power-module substrate 1, so that the bondability of the electric components 7 can be suitably maintained. As described above, in the circuit layer at the middle stage, the hole part 51 open at end parts are formed between the circuit-layer metal-plates 5A and 5B; therefore resin is poured into the hole part 51, so that the resin mold 56 can be held more rigidly.

Figure 11:
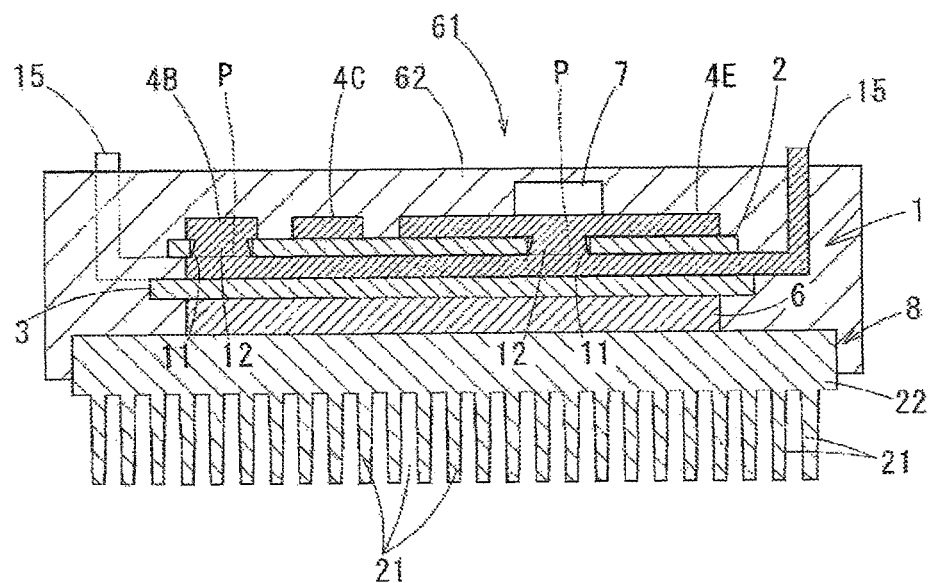
FIG. 11 It is a cross-sectional view of forming the resin mold on a heat-sink-attached power module.

FIG. 11 shows an embodiment in which a resin mold is formed on a heat-sink-attached power module in a state in which a heat sink is fixed. In the heat-sink-attached power module 61, a resin mold 62 is provided so as to cover the electric components 7 and the power-module substrate 1 together; and further so as to cover a part of the heat sink 8, specifically a top plate part of the heat sink connected to the heat-radiation-layer metal-plate 6.

Since a bonding part to the heat sink 8 is also covered with the resin mold 62, it is rigidly integrated as a whole.

The present invention is not limited to the above-described embodiments and various modification may be made without departing from the scope of the present invention. For example, in the second bonding, a copper layer of about 0.4 μm thickness is formed in advance by vapor deposition or the like on a surface of the heat-radiation-layer metal-plate 6 configuring the lowest stage; the second ceramic substrate 3 of the first bonded body 1X is stacked thereon; and these may be connected by transient liquid phase diffusion bonding.

In the transient liquid phase diffusion bonding, there is the copper layer deposited on the surface of the metal plate 6 on an interface between the metal plate 6 and the ceramic substrate 3; the copper is diffused by heating into aluminum of the metal plate 6 first; and copper concentration in the metal plate 6 is increased in a vicinity of the copper layer so that a melting point is fallen; as a result, liquid phase of metal is formed at a bonding interface in an eutectic level of aluminum and copper. By keeping temperature stable in a state in which the liquid phase of metal is formed, the liquid phase of metal is in contact with the ceramic substrate 3 at certain temperature for a certain period of time and reacts; along with further diffusion of copper into aluminum, the copper concentration is gradually reduced in the liquid phase of metal; and the melting point is increased, so that coagulation is progressed while keeping the temperature stable. Accordingly, rigid connection between the metal plate 6 and the ceramic substrate 3 can be obtained and temperature is cooled to room temperature after progress of coagulation. As pressurizing force of that is 98 kPa (1 kgf/cm$^2$) to 3.4 MPa (35 kgf/cm$^2$), and it is heated at 600° C. for 5 hours in vacuo of $10^{-3}$ to $10^{-6}$ Pa.

It may be possible at the same time to connect the ceramic substrate 3 and the metal plate 6 and connect the metal plate 6 and the heat sink 8 using the transient liquid phase diffusion bonding.

Figure 12:
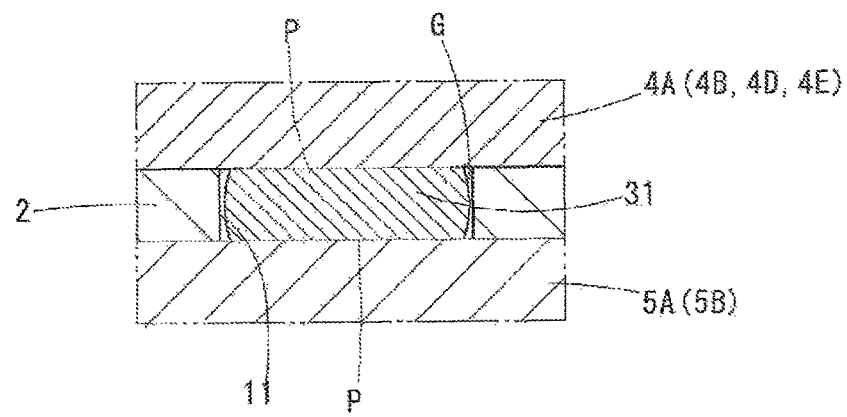
FIG. 12 It is an enlarged sectional view as FIG. 5 showing another example of the vicinity of the bonding part.

It is described as the embodiment in which the protrude parts are integrally formed on the metal plate; however, as shown in FIG. 12, it is possible that: a columnar metal member 31 is formed individually from the metal plates 4 and 5 in advance; the metal member 31 is disposed in the through hole 11 of the ceramic substrate 2; and both end surfaces thereof are connected to the metal plates 4 and 5. In this case, bonding parts P are formed on both the end surface of the metal member 31.

Figure 13:
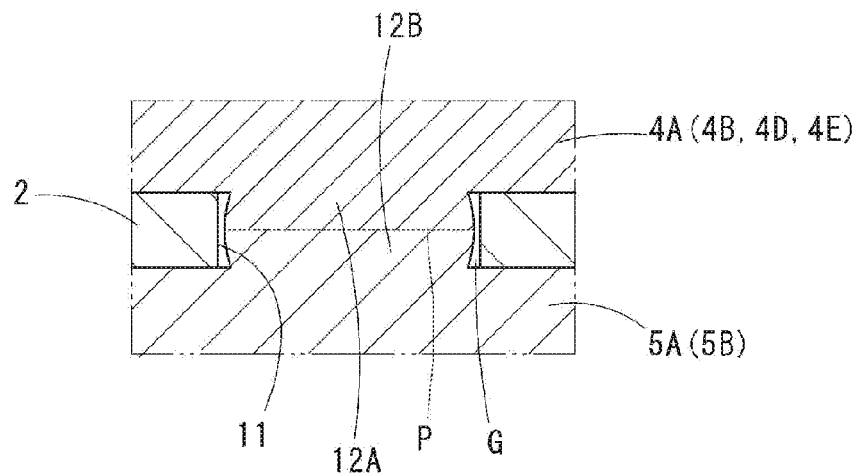
FIG. 13 It is an enlarged sectional view as FIG. 5 showing another example of the bonding part.

Moreover, as shown in FIG. 13, a structure in which protruded parts (metal members) 12A and 12B are formed on the metal plates 4 and 5 respectively, and connected at middle position of length of the through hole 11 of the ceramic substrate 2 can be used. In this case, a bonding part P is formed at the middle part of the through hole 11.

If the metal member is not columnar and is formed in a pillar-shape having a polygonal transverse-cross section and the through hole is formed in the same polygonal shape, the metal member can be prevented from rotating in the through hole, so that positioning of the metal plate can be easily performed in multi-layer structure.

In the above embodiments, the ceramic substrates are two and the metal plates configure three-layer structure. However, it is not limited, the ceramic substrates may be three or more and the metal plates may be stacked.

In the present embodiment, the first ceramic substrate 2 having through holes 11 is obtained by baking after forming through holes at a green sheet by press working before baking ceramics. However, the through hole 11 may be formed by laser working or the like on ceramics after baking.

Figure 14:
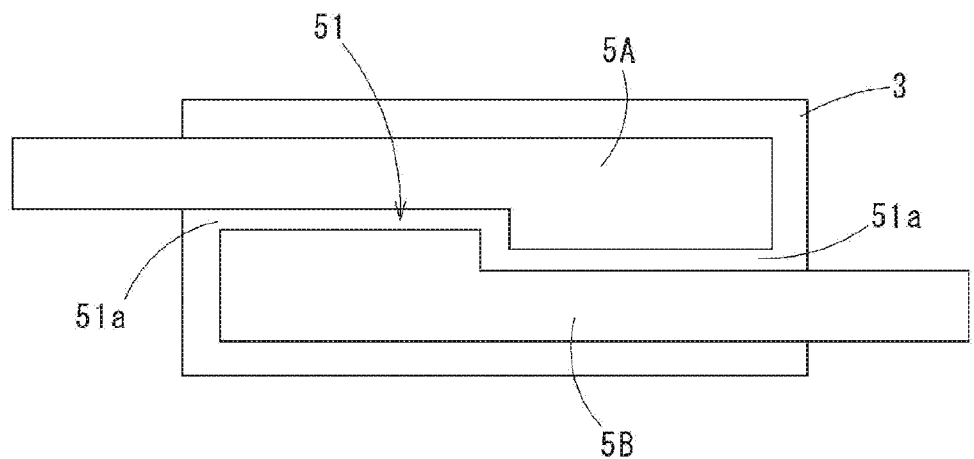
FIG. 14 It is a plan view as FIG. 3 explaining a structure of a circuit layer at a middle stage that is another embodiment of the power-module substrate according to the present invention.
Figure 15:
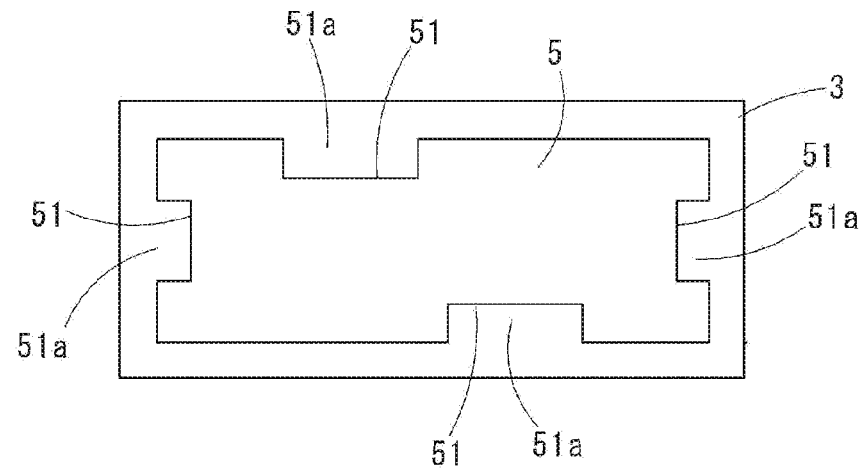
FIG. 15 It is a plan view as FIG. 3 explaining a structure of a circuit layer at a middle stage that is another embodiment of the power-module substrate according to the present invention.

In the present embodiment, the circuit-layer metal-plates 5A and 5B at the middle stage are formed in the long-and-narrow band-plate shape as shown in FIG. 3. However, as shown in FIG. 14, it can be formed by bending into L-shape in planar view; and the hole parts 51 can be formed to be bent by arranging the bent parts to be opposed. The hole parts 51 which open at end parts of the circuit at the middle stage are not limited to the structure of penetrating from one end part to the other end part of the circuit layer. As shown in FIG. 15, the hole parts 51 can be made by cutting off end parts of one circuit-layer metal-plate 5. Also in this case, since the resin is poured into the hole parts 51 and cured, the resin mold can be rigidly held to the power-module substrate.

Furthermore, other than the shape with the straight fins by extrusion molding as the embodiment, the heat sink can be made into a shape having a pin-shaped fins formed by forging or the like, or a shape of plate called a heat-radiation plate. In the present invention, these various types are defined as heat sinks.

INDUSTRIAL APPLICABILITY

The present invention is applicable to a power-module substrate and a power module used for a semiconductor device controlling a large electric current and a large voltage, which can meet high integration by multilayering.

DESCRIPTION OF REFERENCE SYMBOLS 1 power-module substrate
1X first bonded body
2 first ceramic substrate
3 second ceramic substrate
4A to 4E circuit-layer metal-plate (circuit layer at upper stage)

5, 5A, 5B circuit-layer metal-plate (circuit layer at middle stage)
6 heat-radiation-layer metal-plate
7 electric component
8 heat sink
11 through hole
12 protruded part (metal member)
13, 14 brazing material
15 external-connection lead-terminal part
21 fin
22 plate-shape part
31 metal member
51 hole part
51a opening part
55 power module
56 resin mold
61 heat-sink-attached power module
62 resin mold
110 pressurizing device
G gap
P bonding part
S stack body

What is claimed is:

1. A power-module substrate, comprising:
first and second sets of circuit-layer metal-plates made of copper or copper alloy bonded in a layered state to top and bottom surfaces, respectively, of a first ceramic substrate;
a metal member connecting the first and second sets of circuit-layer metal-plates and extending through a hole formed in the first ceramic substrate;
a second ceramic substrate bonded at a top surface thereof to a bottom surface of the second set of circuit-layer metal-plates in the layered state;
a heat-radiation-layer metal-plate made of aluminum or aluminum alloy bonded to a bottom surface of the second ceramic substrate;
an electric component attached to a top surface of one of the first set of circuit-layer metal-plates above the metal member and the through hole;
a lead-terminal part for external connection protruding outward from the first ceramic substrate formed integrally on the second set of circuit-layer metal-plates; and
a protrusion part of the second ceramic substrate protruding outward from the first ceramic substrate in a surface direction and supporting at least a part of the lead-terminal part at a top surface thereof,
wherein the power-module substrate is configured to conduct heat from the electric component through the through hole via the metal member, along the second set of circuit-layer metal-plates, and to the heat-radiation-layer metal-plate.

2. The power-module substrate according to claim 1, wherein the lead-terminal part for external connection protruding outward from the first ceramic substrate is formed integrally on the circuit-layer metal-plate at a middle stage disposed between the first ceramic substrate and the second ceramic substrate.

3. The power-module substrate according to claim 2, wherein:
the protrusion part protruding outward from the first ceramic substrate is formed on the second ceramic substrate; and
at least a part of the lead-terminal part is supported on the protrusion part on the second ceramic substrate.

4. The power-module substrate according to claim 1, wherein in a circuit layer at a middle stage formed between the first ceramic substrate and the second ceramic substrate, a hole part opening at an end of the circuit layer at the middle stage is formed.

5. The power-module substrate according to claim 2, wherein in a circuit layer at the middle stage formed between the first ceramic substrate and the second ceramic substrate, a hole part opening at an end of the circuit layer at the middle stage is formed.

6. The power-module substrate according to claim 3, wherein in a circuit layer at the middle stage formed between the first ceramic substrate and the second ceramic substrate, a hole part opening at an end of the circuit layer at the middle stage is formed.

7. A power module according to claim 1, wherein the power-module substrate and the electric component are sealed by a resin mold except a surface of the heat-radiation-layer metal-plate.

8. A heat-sink-attached power module comprising:
the power-module substrate according to claim 1; and
a heat sink bonded to the heat-radiation-layer metal-plate of the power-module substrate, wherein:
the power-module substrate and the electric component are sealed by a resin mold; and
a part of the heat sink is covered with the resin mold.

9. A power module comprising the power-module substrate according to claim 2, wherein the power-module substrate and the electric component are sealed by a resin mold except a surface of the heat-radiation-layer metal-plate.

10. A power module comprising the power-module substrate according to claim 3, wherein the power-module substrate and the electric component are sealed by a resin mold except a surface of the heat-radiation-layer metal-plate.

11. A power module comprising the power-module substrate according to claim 4, wherein the power-module substrate and the electric component are sealed by a resin mold except a surface of the heat-radiation-layer metal-plate.

12. A power module comprising the power-module substrate according to claim 5, wherein the power-module substrate and the electric component are sealed by a resin mold except a surface of the heat-radiation-layer metal-plate.

13. A power module comprising the power-module substrate according to claim 6, wherein the power-module substrate and the electric component are sealed by a resin mold except a surface of the heat-radiation-layer metal-plate.

14. A heat-sink-attached power module comprising:
the power-module substrate according to claim 2;
a heat sink bonded to the heat-radiation-layer metal-plate of the power-module substrate, wherein:
the power-module substrate and the electric component are sealed by a resin mold; and
a part of the heat sink is covered with the resin mold.

15. A heat-sink-attached power module comprising:
the power-module substrate according to claim 3;
a heat sink bonded to the heat-radiation-layer metal-plate of the power-module substrate, wherein:
the power-module substrate and the electric component are sealed by a resin mold; and
a part of the heat sink is covered with the resin mold.

16. A heat-sink-attached power module comprising:
the power-module substrate according to claim 4;

a heat sink bonded to the heat-radiation-layer metal-plate of the power-module substrate, wherein:

the power-module substrate and the electric component are sealed by a resin mold; and a part of the heat sink is covered with the resin mold.

17. A heat-sink-attached power module comprising:

the power-module substrate according to claim 5;

a heat sink bonded to the heat-radiation-layer metal-plate of the power-module substrate, wherein:

the power-module substrate and the electric component are sealed by a resin mold; and a part of the heat sink is covered with the resin mold.

18. A heat-sink-attached power module comprising:

the power-module substrate according to claim 6;

a heat sink bonded to the heat-radiation-layer metal-plate of the power-module substrate, wherein:

the power-module substrate and the electric component are sealed by a resin mold; and a part of the heat sink is covered with the resin mold.

* * * * *